United States Patent
Cheng et al.

(10) Patent No.: US 8,003,488 B2
(45) Date of Patent: Aug. 23, 2011

(54) SHALLOW TRENCH ISOLATION STRUCTURE COMPATIBLE WITH SOI EMBEDDED DRAM

(75) Inventors: Kangguo Cheng, Beacon, NY (US); Munir D. Naeem, Poughkeepsie, NY (US); David M. Dobuzinsky, Hopewell Junction, NY (US); Byeong Y. Kim, Lagrangeville, NY (US)

(73) Assignee: International Business Machines Corporation, Armonk, NY (US)

(*) Notice: Subject to any disclaimer, the term of this patent is extended or adjusted under 35 U.S.C. 154(b) by 151 days.

(21) Appl. No.: 11/861,614

(22) Filed: Sep. 26, 2007

(65) Prior Publication Data

US 2009/0079027 A1  Mar. 26, 2009

(51) Int. Cl.
*H01L 23/48* (2006.01)
*H01L 21/4763* (2006.01)

(52) U.S. Cl. ......... 438/430; 438/400; 438/424; 257/499
(58) Field of Classification Search .......... 257/499, 257/522, E21.495, E23.01; 438/400, 424, 438/430
See application file for complete search history.

(56) References Cited

U.S. PATENT DOCUMENTS

| | | | |
|---|---|---|---|
| 5,030,549 A | 7/1991 | Hashimoto et al. | |
| 6,117,726 A * | 9/2000 | Tsai et al. | 438/242 |
| 6,242,344 B1 | 6/2001 | Koh et al. | |
| 6,297,088 B1 * | 10/2001 | King | 438/243 |
| 6,326,261 B1 * | 12/2001 | Tsang et al. | 438/243 |
| 6,426,252 B1 * | 7/2002 | Radens et al. | 438/243 |
| 6,774,008 B1 * | 8/2004 | Su et al. | 438/424 |
| 2004/0248363 A1 * | 12/2004 | Bard et al. | 438/243 |
| 2006/0051958 A1 * | 3/2006 | Ho | 438/638 |
| 2006/0124982 A1 * | 6/2006 | Ho et al. | 257/304 |
| 2007/0218679 A1 * | 9/2007 | Schneider et al. | 438/638 |
| 2007/0275523 A1 * | 11/2007 | Su et al. | 438/238 |
| 2008/0044995 A1 * | 2/2008 | Kang et al. | 438/597 |
| 2008/0064178 A1 * | 3/2008 | Ho et al. | 438/389 |

* cited by examiner

*Primary Examiner* — Leonardo Andújar
*Assistant Examiner* — Jordan Klein
(74) *Attorney, Agent, or Firm* — Scully, Scott, Murphy & Presser, P.C.; H. Daniel Schnurmann

(57) ABSTRACT

A deep trench is formed in a semiconductor-on-insulator (SOI) substrate and a pad layer thereupon. A conductive trench fill region is formed in the deep trench. A planarizing material layer having etch selectivity relative to the pad layer is applied. A portion of the pad layer having an edge that is vertically coincident with a sidewall of the deep trench is exposed by lithographic means. Exposed portion of the pad layer are removed selective to the planarizing material layer, followed by removal of exposed portion of a semiconductor layer selective to the conductive trench fill region by an anisotropic etch. The planarizing material layer is removed and a shallow trench isolation structure having a lower sidewall that is self-aligned to an edge of the original deep trench is formed. Another shallow trench isolation structure may be formed outside the deep trench concurrently.

4 Claims, 15 Drawing Sheets

US 8,003,488 B2

SHALLOW TRENCH ISOLATION STRUCTURE COMPATIBLE WITH SOI EMBEDDED DRAM

FIELD OF THE INVENTION

The present invention relates to a shallow trench isolation structure that is compatible with semiconductor-on-insulator (SOI) embedded dynamic random access memory (eDRAM) and methods of manufacturing the same.

BACKGROUND OF THE INVENTION

Embedded dynamic random access memory (eDRAM) is a dynamic random access memory (DRAM) embedded in a logic circuit to function as a high density cache memory. The eDRAM provides comparable access time as static random access memory (SRAM) at a smaller device area per cell. Typically, eDRAM arrays are employed as an L2 level cache or L3 level cache in a processor to provide a high density memory in a processor core. Due to high performance and a compact size, eDRAM has become one of the most efficient means for continued performance of semiconductor logic circuits requiring embedded memory including processors and system-on-chip (SoC) devices.

Manufacturing of an eDRAM into a logic circuit in general introduces challenges in process integration, one of which is formation of shallow trench isolation that is compatible with the eDRAM and logic devices. While formation of the shallow trench isolation in a logic region may be effected by a standard complementary metal-oxide-semiconductor (CMOS) shallow trench isolation (STI) process, use of such a process introduces adverse or deleterious structural features in an embedded dynamic random access memory (eDRAM) region since the eDRAM region contains deep trenches comprising different materials than the logic region. Formation of such adverse or deleterious features is exacerbated if the substrate is a semiconductor-on-insulator (SOI) substrate.

Referring to FIG. 1, a prior art eDRAM structure formed in an SOI substrate 8'. The SOI substrate 8' comprises a handle substrate 10', a buried insulator layer 20', and a top semiconductor layer 30'. The SOI substrate 8' further comprises a pair of deep trenches, each of which comprise a node dielectric 50' and a doped polysilicon fill 60'. The region of the handle substrate 10' abutting the node dielectric 50' is electrically doped to form a buried plate 6'.

The pair of deep trenches are formed by first providing an SOI substrate 8' that does not contain any pattern, e.g., as provided by a commercial supplier of an SOI substrate 8'. A pad layer 40' is formed directly on the top semiconductor layer 30' by chemical vapor deposition (CVD). Optionally, a buffer layer (not shown), which is typically a thermal oxide layer, may be formed on top of the top semiconductor layer 30' prior to formation of the pad layer 40'. A first photoresist (not shown) is applied over the pad layer 40' and lithographically patterned to form openings over areas in which deep trenches are to be formed. The pattern is transferred into the pad layer 40', the top semiconductor layer 30', the buried insulator layer 20', and the handle substrate 10' to form the pair of deep trenches. A buried plate 6' is formed outside the sidewalls of the deep trenches by diffusing dopants into the handle substrate 10' from within the deep trenches. The node dielectric 50' is formed on a sidewall of each of the pair of deep trenches, for example, by nitridation and/or deposition of silicon nitride. The pair of deep trenches is filled with doped polysilicon to form a pair of polysilicon trench fill regions 60'. Each of the polysilicon trench fill regions 60' is recessed from a top surface of the pad layer 40' to a first recess depth r1' between a top surface of the buried insulator layer 20' and a bottom surface of the buried insulator layer 20'. The node dielectric 50' above the first recess depth r1' of the polysilicon trench fill region 60' is removed at this point. Additional doped polysilicon material is then deposited over the polysilicon trench fill regions 60' to fill the pair of deep trenches, and then planarized and recessed from the top surface of the pad layer 40' to a second recess depth r2' which is between a top surface of the top semiconductor layer 30' and a bottom surface of the top semiconductor layer 30'. By annexation of the additional doped polysilicon material, the polysilicon trench fill regions 60' extends up to the second recess depth r2'.

Referring to FIG. 2, a second photoresist 90' is applied over the pad layer 40' and the polysilicon trench fill regions 60'. The second photoresist 90' is lithographically patterned to form a first opening O1' over a first shallow trench isolation area above the pair of deep trenches and a second opening O2' over a second shallow trench isolation area outside the pair of deep trenches. The pattern of the first opening O1' and the second opening O2' is transferred into the top semiconductor layer 30' and the polysilicon trench fill regions 60'.

Due to inhomogeneous composition between the top semiconductor layer 30' and the polysilicon trench fill regions 60', a non-uniform etch profile is obtained after the transfer of the pattern in the second photoresist 90'. Specifically, the buried insulator layer 20' functions as a built-in etch-stop layer for a reactive ion etch that removes the semiconductor material of the top semiconductor layer 30'. However, the polysilicon trench fill regions 60' does not contain any built-in etch-stop layer and the reactive ion etch continues beneath the level of the top surface of the buried insulator layer 20'. Further, the polysilicon trench fill regions 60' comprises doped polysilicon which has a higher rate of etch than the semiconductor material of the top semiconductor layer 30', which comprises single crystalline semiconductor material such as silicon and typically has a doping of low concentration, e.g., below $1.0 \times 10^{17}/cm^3$ in atomic concentration.

Thus, the combination of a higher etch rate of the polysilicon trench fill regions 60' compared with the etch rate of the top semiconductor layer 30' and the lack of a built-in etch-stop layer typically cause formation of divots in the polysilicon trench fill regions 60' during the reactive ion etch. Further, in the case that the divots extend beneath the bottom surface of the buried insulator layer 20', portions of the node dielectric 50' may be damaged and/or thinned to form damaged node dielectric portions 50D, which may increase leakage of deep trench capacitors comprising the node dielectric 50' and/or degrade reliability of the node dielectric 50'. Formation of such divots in the polysilicon trench fill regions 60' thus causes deleterious effects on performance of the prior art eDRAM structure.

In view of the above, there exists a need for a semiconductor structure including an embedded dynamic random access memory (eDRAM) structure that is compatible with a semiconductor-on-insulator (SOI) substrate and is substantially free of deleterious structural features introduced during formation of shallow trench isolation, and methods of manufacturing the same.

Further, there exists a need for a semiconductor structure including a deep trench and a shallow trench isolation structure formed in an SOI substrate and is substantially free of deleterious structural features that may compromise performance or reliability of a deep trench capacitor formed therefrom.

Specifically, there exists a need for a semiconductor structure including a deep trench and a shallow trench isolation structure formed in an SOI substrate and is substantially free of damage to a node dielectric and divot formation within a fill material of the deep trench.

SUMMARY OF THE INVENTION

The present invention addresses the needs described above by providing a semiconductor structure including a shallow trench isolation structure having a lower sidewall that is self-aligned to a sidewall of a portion of a buried insulator layer and methods of manufacturing the same.

In the present invention, a deep trench is formed in a semiconductor-on-insulator (SOI) substrate and a pad layer thereupon. A node dielectric is formed in the deep trench, which is then filled by a conductive trench fill region having a topmost surface that is recessed below a top surface of the SOI substrate. A planarizing material layer having etch selectivity relative to the pad layer is applied followed by application of a photoresist. A pattern formed in the photoresist is transferred into the planarizing material layer by an etch process to expose a portion of the pad layer having an edge that is vertically coincident with a sidewall of the deep trench. Another portion of the pad layer may be exposed outside the region containing the deep trench. Exposed portions of the pad layer are removed selective to the planarizing material layer, followed by removal of exposed portions of a semiconductor layer selective to the conductive trench fill region by an anisotropic etch. The planarizing material layer is removed and a shallow trench isolation structure having a lower sidewall that is self-aligned to an edge of the original deep trench is formed. Consequently, the lower sidewall is self-aligned to a sidewall of a portion of a buried insulator layer, an outer edge of the node dielectric, and an outer edge of the conducive trench fill region which has a substantially constant horizontal cross-sectional area between a topmost surface of the conductive trench fill region and a top surface of the node dielectric located between a top surface of the buried insulator layer and a bottom surface of the buried insulator layer.

Another shallow trench isolation structure may be formed outside the deep trench concurrently to provide shallow trench isolation for logic devices formed on the same semiconductor substrate. The deep trench may be employed to form an embedded DRAM device that provides an on-chip memory for the logic devices.

According to an aspect of the present invention, a semiconductor structure is provided, which comprises:

a deep trench located in a semiconductor-on-insulator (SOI) substrate;

a conductive trench fill region located in the deep trench and laterally abutting a portion of a top semiconductor layer; and a shallow trench isolation structure including an upper sidewall, a lower sidewall, and a substantially horizontal surface directly adjoined to the upper sidewall and the lower sidewall, wherein the lower sidewall is self-aligned to, and adjoined to, a sidewall of a portion of a buried insulator layer, and wherein the portion of the buried insulator layer laterally abuts the conductive trench fill region.

In one embodiment, the lower sidewall laterally abuts, and is self-aligned to, a sidewall of the deep trench, wherein the sidewall of the deep trench extends from a bottommost surface of the deep trench to a topmost surface of the conductive trench fill region without a step or a kink.

In another embodiment, the lower sidewall is substantially vertically coincident with, and is self-aligned to an outer edge of a node dielectric in the deep trench.

In even another embodiment, the lower sidewall laterally abuts, and is self-aligned to, an outer edge of the conductive trench fill region.

In yet another embodiment, the conductive trench fill region has a substantially constant horizontal cross-sectional area between a topmost surface of the conductive trench fill region and a top surface of a node dielectric, wherein the top surface of the node dielectric is located between a top surface of the buried insulator layer and a bottom surface of the buried insulator layer.

In still another embodiment, the conductive trench fill region is free of a step between a planar topmost surface of the conductive trench fill region and a top surface of the buried insulator layer.

In still yet another embodiment, the buried insulator layer has a top surface located at a constant depth throughout the entirety of the SOI substrate, and wherein the shallow trench isolation structure has a planar bottommost surface vertically abutting the top surface of the buried insulator layer.

In a further embodiment, the shallow trench isolation structure comprises a first dielectric material, and the buried insulator material comprises a second dielectric material, wherein the first dielectric material and the second dielectric material are different.

In an even further embodiment, the shallow trench isolation structure comprises undoped silicate glass (USG) and the buried insulator layer comprises thermal silicon oxide.

In a yet further embodiment, the conductive trench fill region comprises a doped semiconductor material.

In a still further embodiment, the doped semiconductor material comprises doped polysilicon.

According to another aspect of the present invention, a semiconductor structure is provided, which comprises:

a deep trench located in a semiconductor-on-insulator (SOI) substrate;

a conductive trench fill region located in the deep trench and laterally abutting a portion of a top semiconductor layer;

a first shallow trench isolation structure including an upper sidewall, a lower sidewall, and a substantially horizontal surface directly adjoined to the upper sidewall and the lower sidewall, wherein the lower sidewall is self-aligned to, and adjoined to, a sidewall of a portion of a buried insulator layer, and wherein the portion of the buried insulator layer laterally abuts the conductive trench fill region; and a second shallow trench isolation structure disjoined from the deep trench and vertically abutting the buried insulator layer.

In one embodiment, the lower sidewall laterally abuts, and is self-aligned to, a sidewall of the deep trench, wherein the sidewall of the deep trench extends from a bottommost surface of the deep trench to a topmost surface of the conductive trench fill region without a step or a kink.

In another embodiment, the lower sidewall is substantially vertically coincident with, and is self-aligned to an outer edge of a node dielectric in the deep trench.

In even another embodiment, the lower sidewall laterally abuts, and is self-aligned to, an outer edge of the conductive trench fill region.

In yet another embodiment, the conductive trench fill region has a substantially constant horizontal cross-sectional area between a topmost surface of the conductive trench fill region and a top surface of a node dielectric, wherein the top surface of the node dielectric is located between a top surface of the buried insulator layer and a bottom surface of the buried insulator layer.

In still another embodiment, the conductive trench fill region is free of a step between a planar topmost surface of the conductive trench fill region and a top surface of the buried insulator layer.

In still yet another embodiment, the buried insulator layer has a top surface located at a constant depth throughout the entirety of the SOI substrate, and wherein the first shallow trench isolation structure has a planar bottommost surface vertically abutting the top surface of the buried insulator layer.

In a further embodiment, the first shallow trench isolation structure and the second shallow trench isolation structure comprise a first dielectric material, and the buried insulator material comprises a second dielectric material, wherein the first dielectric material and the second dielectric material are different.

In an even further embodiment, the first shallow trench isolation structure and the second shallow trench isolation structure comprise undoped silicate glass (USG) and the buried insulator layer comprises thermal silicon oxide.

In a yet further embodiment, the conductive trench fill region comprises a doped semiconductor material.

In a still further embodiment, the doped semiconductor material comprises doped polysilicon.

According to yet another aspect of the present invention, a method of fabricating a semiconductor structure is provided, which comprises:

forming a pad layer on a semiconductor-on-insulator (SOI) substrate;

forming a deep trench in the pad layer and the SOI substrate;

forming a conductive trench fill region in the deep trench, wherein a topmost surface of the conductive trench fill region is recessed below a top surface of the SOI substrate;

removing a portion of the pad layer and exposing a top semiconductor portion, wherein a remaining portion of the pad layer includes a sidewall that is vertically coincident with, and is directly adjoined to, a sidewall of the deep trench, and wherein the top semiconductor portion laterally abuts another sidewall of the deep trench;

removing the top semiconductor portion and exposing a top surface of a buried insulator layer; and forming a shallow isolation trench structure directly on the top surface of the buried insulator layer and the conductive trench fill.

In one embodiment, the shallow trench isolation structure comprises a lower sidewall which laterally abuts, and is self-aligned to, the sidewall of the deep trench, wherein the sidewall of the deep trench extends from a bottommost surface of the deep trench to a topmost surface of the conductive trench fill region without a step or a kink.

In another embodiment, the method further comprises:

applying a planarization material layer on a top surface of the conductive trench fill region and the pad layer;

applying a bottom anti-reflective coating (BARC) layer on the planarization material layer; and applying a photoresist layer on the BARC layer.

In even another embodiment, the method further comprises:

forming a first opening in the photoresist layer overlying a portion of the conductive trench fill region, wherein an edge of the first opening overlies the conductive trench fill region; and exposing the pad layer portion from below the first opening; wherein an entirety of a top surface of the conductive trench fill region is covered by the planarization material layer during the removing of the pad layer portion.

In yet another embodiment, the method further comprises forming a second opening in the photoresist layer concurrently with the forming of the first opening in the photoresist layer, wherein the second opening does not overlie the deep trench.

In still another embodiment, an entirety of a top surface of the conductive trench fill region is covered by the planarization material layer during the removing of the top semiconductor portion.

In still yet another embodiment, the method further comprises forming a node dielectric on sidewalls of the deep trench prior to the forming of the conductive trench fill region, and the forming of the conductive trench fill region includes:

filling the deep trench with a conductive trench fill material;

planarizing and recessing the conductive trench fill material to a first recess depth below a top surface of the buried insulator layer within the deep trench;

removing exposed portions of the node dielectric;

filling the deep trench with another conductive trench fill material; and planarizing and recessing the another conductive trench fill material to a second recess depth below a top surface of the pad layer within the deep trench, wherein the second recess depth is less than the first recess depth, and wherein the conductive trench fill material and the another conductive trench fill material within the deep trench collectively constitute the conductive trench fill region.

In a further embodiment, the planarization material layer and the portion of the pad layer are removed in a same process chamber in an integrated etch process without removal of said semiconductor structure out of said process chamber.

In a yet further embodiment, the BARC layer, the planarization material layer, and the portion of the pad layer are removed in a same process chamber in an integrated etch process without removal of said semiconductor structure out of said process chamber.

In a still further embodiment, the planarization layer, the portion of the pad layer, and the top semiconductor portion are removed in a same process chamber in an integrated etch process without removal of said semiconductor structure out of said process chamber.

In a still yet further embodiment, the BARC layer, the planarization layer, the portion of the pad layer, and the top semiconductor portion are removed in a same process chamber in an integrated etch process without removal of said semiconductor structure out of said process chamber.

DETAILED DESCRIPTION OF THE INVENTION

Figure 1:
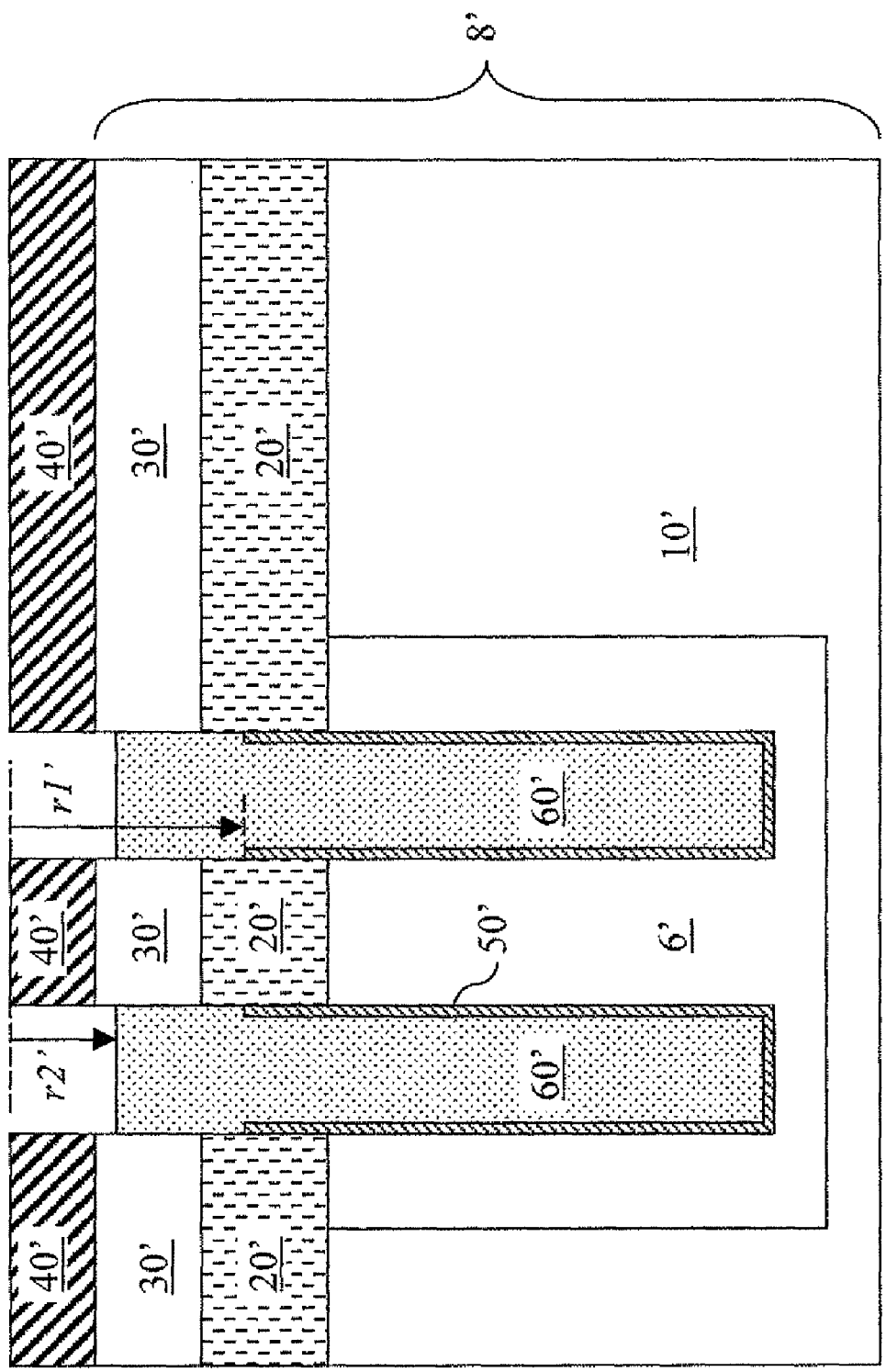
FIGS. 1-2 are sequential vertical cross-sectional views of a prior art exemplary semiconductor structure including a pair of trench capacitors that may be used in an embedded DRAM cell.
Figure 2:
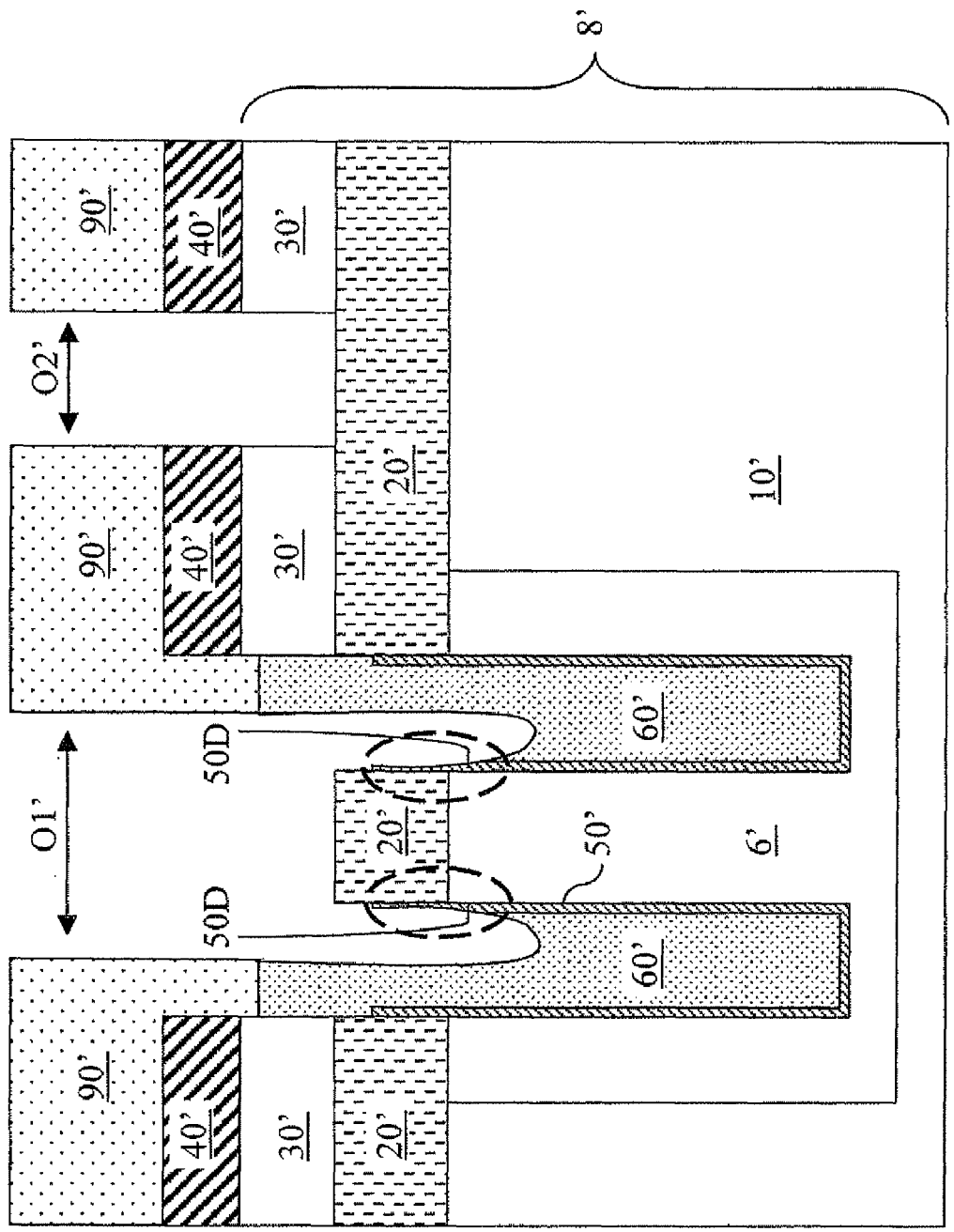

As stated above, the present invention relates to a shallow trench isolation structure that is compatible with semiconductor-on-insulator (SOI) embedded dynamic random access memory (eDRAM) and methods of manufacturing the same, which are now described in detail with accompanying figures. It is noted that like and corresponding elements mentioned herein and illustrated in the drawings are referred to by like reference numerals.

Figure 3:
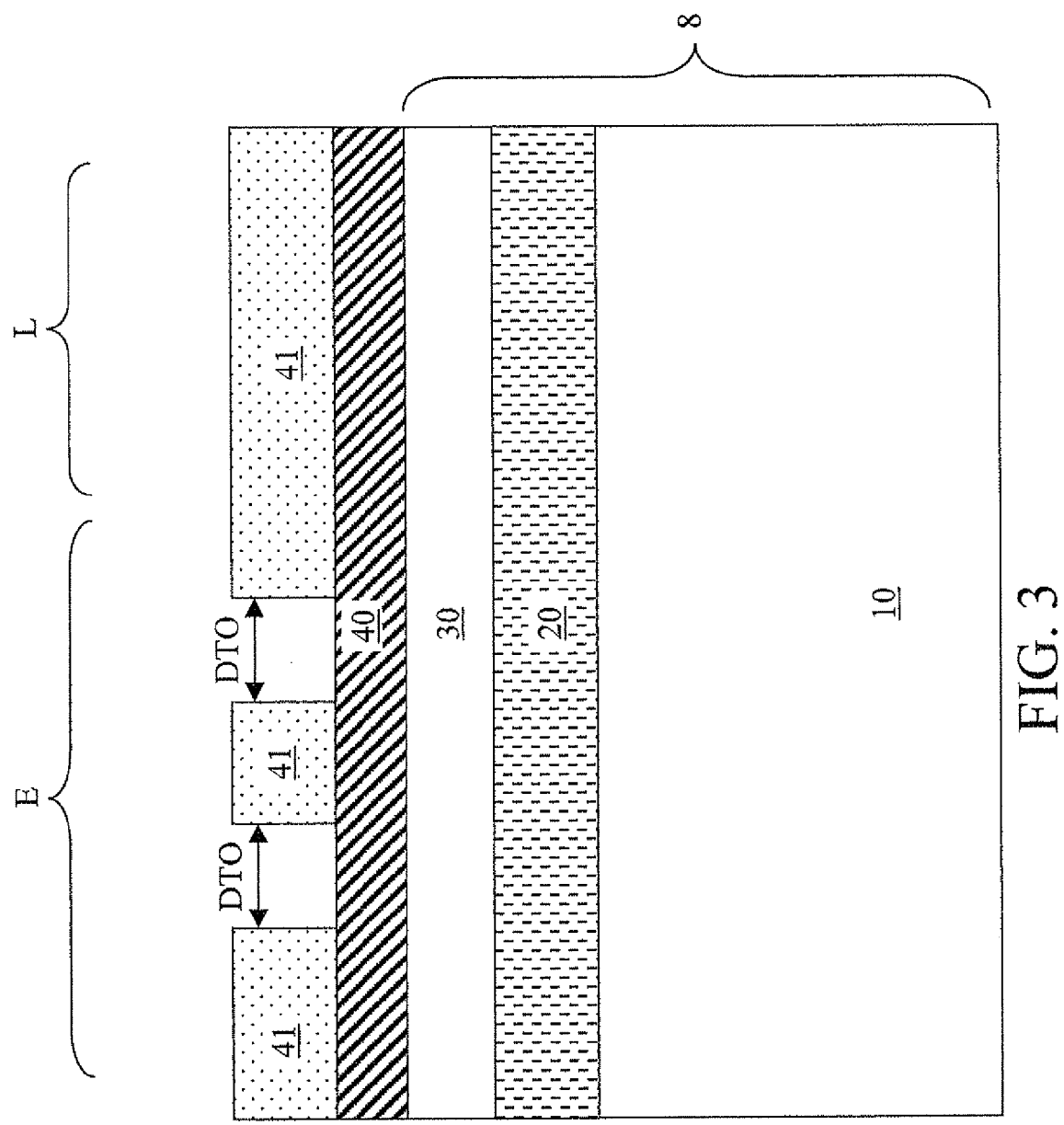
FIGS. 3-14 are sequential vertical cross-sectional view of a first exemplary semiconductor structure according to the present invention.

Referring to FIG. 3, a first exemplary interconnect structure according to the present invention is shown, which comprises a pair of deep trenches formed in a semiconductor-on-insulator (SOI) substrate 8 and a pad layer 40 formed thereupon. The first exemplary semiconductor structure comprises an embedded dynamic random access memory (eDRAM) region E which contains the pair of deep trenches and a logic region L in which a semiconductor device is to be subsequently formed. The term "deep trench" denotes a trench formed in a semiconductor substrate having a sufficient depth to be employed to form a capacitor.

The SOI substrate 8 containing a handle substrate 10, a buried insulator layer 20, and a top semiconductor layer 30. The handle substrate 10 comprises a semiconductor material such as silicon. Preferably, the handle substrate 10 comprises a single crystalline semiconductor material. The handle substrate 10 may be undoped or have a p-type doping or an n-type doping. The handle substrate 10 may be doped at a dopant concentration from about $1.0 \times 10^{13}/cm^3$ to about $3.0 \times 10^{17}/cm^3$. The buried insulator layer 20 comprises a dielectric material such as silicon oxide and/or silicon nitride. For example and in one embodiment, the buried insulator layer 20 may comprise thermal silicon oxide. The thickness of the buried insulator layer 20 may be from about 20 nm to about 500 nm, and typically from about 100 nm to about 200 nm.

The top semiconductor layer 30 comprises a semiconductor material. The thickness of the top semiconductor layer 30 may be from about 5 nm to about 300 nm, and preferably from about 20 nm to about 100 nm. Preferably, the top semiconductor layer 30 comprises a single crystalline semiconductor material. The semiconductor material of the top semiconductor layer 30 may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. The top semiconductor layer 30 may have a built-in biaxial stress in a horizontal plane, i.e., in the plane parallel to the interface between the buried insulator layer 20 and the top semiconductor layer 30.

The pair of deep trenches in the eDRAM region is formed by providing an unpatterned SOI substrate 8, which is commercially available or may be prepared utilizing techniques well known in the art. While the first exemplary semiconductor structure comprises a pair of deep trenches that are placed in proximity from each other, the present invention may be practiced in other arrangements including a single isolated deep trench. Such variations are explicitly contemplated herein. The pad layer 40 is formed directly on the top semiconductor layer 30 by a blanket deposition employing chemical vapor deposition (CVD). Preferably, the pad layer 40 comprises a dielectric material such as a dielectric nitride or a dielectric oxide. The pad layer 40 may comprise a stack of multiple dielectric layers or a combination of at least one dielectric layer and at least one semiconductor layer comprising silicon or a silicon containing alloy. For example and in one embodiment, the pad layer 40 is a silicon nitride layer. In another example, the pad layer 40 comprises a stack of a thin silicon oxide layer formed directly on the top semiconductor layer 30, a thicker silicon nitride layer on the thin silicon oxide layer, and a thicker silicon oxide layer on the silicon nitride layer. The thickness of the pad layer 40 may be from about 80 nm to about 1,000 nm, and preferably from about 120 nm to about 250 nm.

A first photoresist 41 is applied over the pad layer 40 and lithographically patterned to form openings in the first photoresist 41, which is herein referred to as deep trench openings DTO, in the eDRAM region E.

Figure 4:
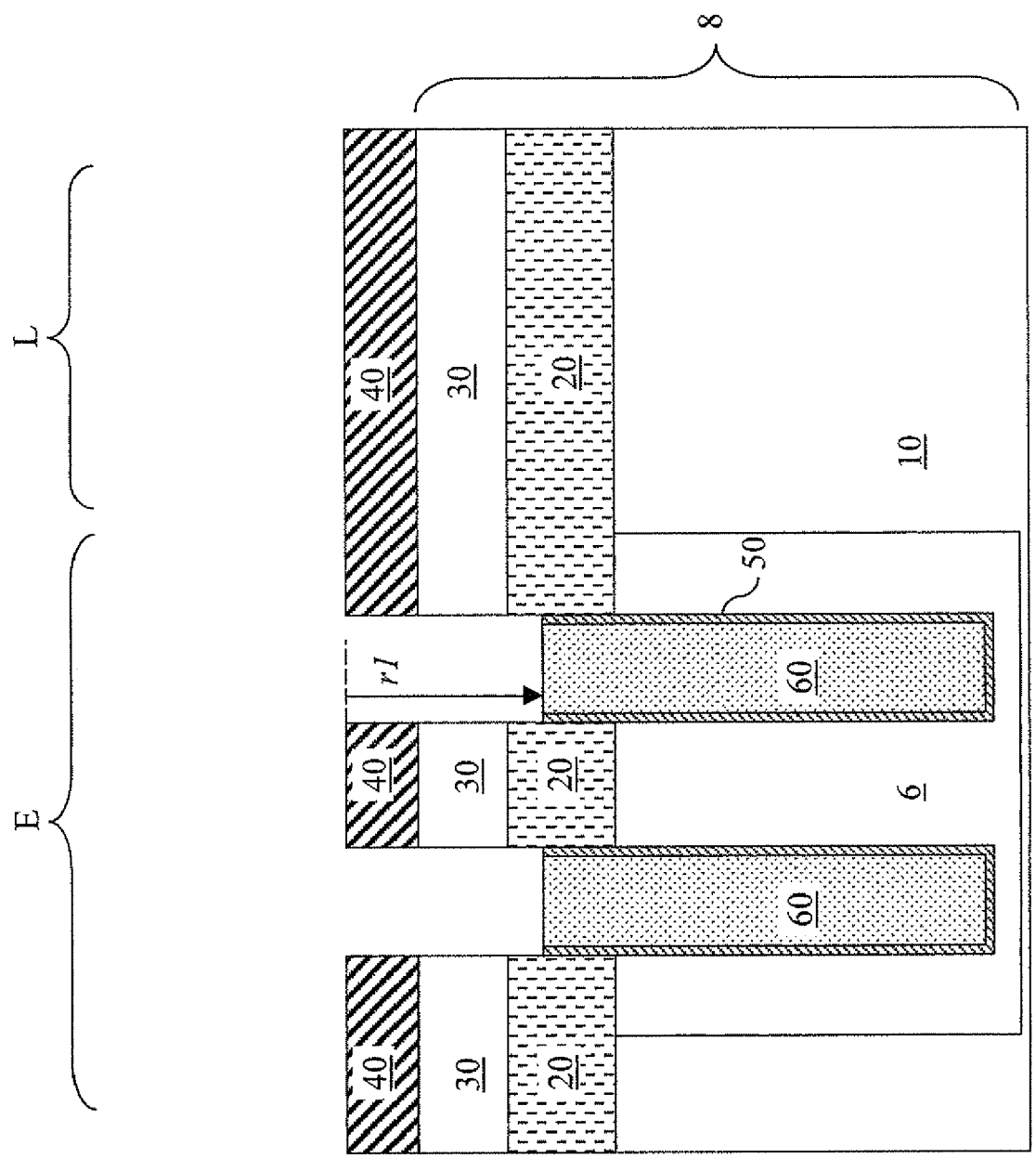

Referring to FIG. 4, the pattern including the deep trench opening DTO in the first photoresist 41 is transferred into the pad layer 40, the top semiconductor layer 30, the buried insulator layer 20, and the handle substrate 10 to form the pair of deep trenches by any known methods such as reactive ion etch (RIE). The depth of the pair of deep trenches, as measured from a top surface of the SOI substrate 8 to bottom surfaces of the deep trenches, may be from about 0.8 mm to about 20 µm, and preferably from about 2 µm to about 8 µm. A portion of the pad layer 40 may be consumed during the formation of the deep trenches or be removed after the formation of the deep trenches. A buried plate 6 is formed in the handle substrate 10, for example, by depositing a dopant containing material layer (not shown) such as arsenosilicate glass (ASG) and outdiffusion dopants into the portion of the handle substrate 10 that directly abuts sidewalls of the deep trenches beneath a bottom surface of the buried insulator layer 20. The dopant containing material layer is subsequently removed. The buried plate 6 can be formed by any other alternative method, including but not limited to, ion implantation, gas phase doping, plasma doping, plasma immersion ion implantation, infusion doping, and liquid phase doping.

The node dielectric 50 is formed on sidewalls of the pair of deep trenches. The node dielectric 50 may comprise silicon oxide, silicon nitride, silicon oxynitride, high-k material, or any combination of these materials. Examples of high-k material include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate, and any combination of these materials. Forming the node dielectric 50, depending on the node dielectric material, may include performing a thermal oxidation, chemical oxidation, thermal nitridation, atomic layer deposition (ALD), chemical vapor deposition (CVD), low-pressure chemical vapor deposition (LPCVD), and/or any other suitable methods. In one embodiment, the node dielectric 50 comprises oxynitride formed by thermal nitridation followed by LPCVD and thermal oxidation.

The pair of deep trenches is then filled with a conductive trench fill material, which may be, for example, a doped semiconductor material such as doped polysilicon The conductive trench fill material may be deposited, for example, by low pressure chemical vapor deposition (LPCVD). Alternative conductive trench fill materials include but are not limited to germanium, silicon germanium, a metal (e.g., tungsten), a conducting metallic compound material (e.g., titanium nitride), and conductive carbon. Using any suitable combination of those conductive materials is also explicitly contemplated herein. The portion of the conductive trench fill material above the pad layer 40 is removed by planarization, which may employ chemical mechanical polishing (CMP), a dry etch, and/or a wet etch. For example, the trench fill material may be planarized by chemical mechanical polishing (CMP) employing the pad layer 40 as a stopping layer. The conductive trench fill material within the deep trenches is removed by a first recess etch that recesses top surfaces of the remaining conductive trench fill material to a first recess depth r1 below a top surface of the pad layer 40. The first recess depth r1 is located between a top surface of the buried insulator layer 20 and a bottom surface of the buried insulator layer 20. The first recess depth r1 is typically about 250 nm, although lesser and greater recess depths are explicitly contemplated herein also. The remaining portion of the conductive trench fill material within the deep trenches constitutes conductive trench fill regions 60. The portions of the node dielectric 50 above a top surface of the conductive trench fill regions 60 are removed, for example, by a wet etch.

Figure 5:
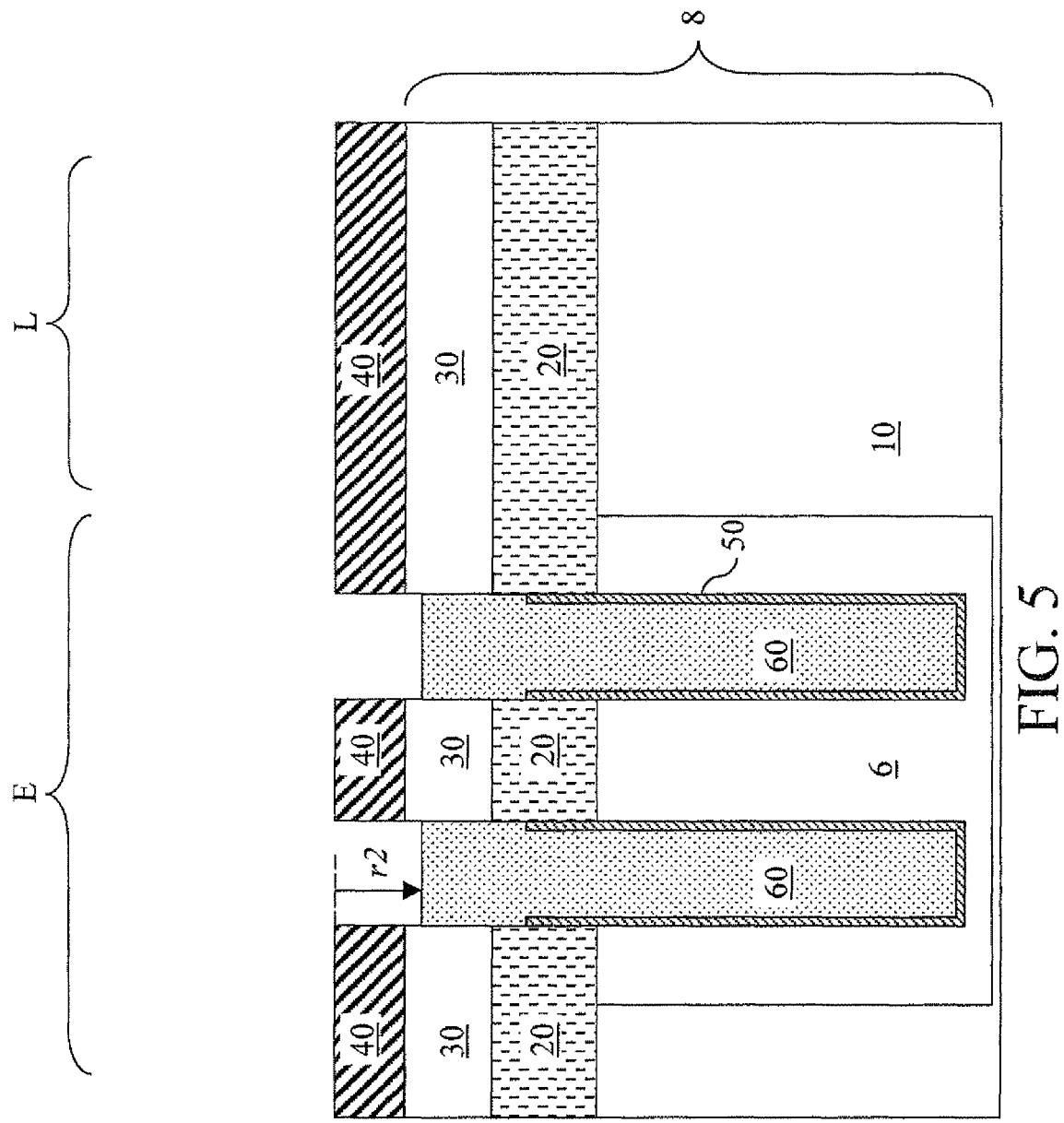

Referring to FIG. 5, additional conductive trench fill material is then deposited over the conductive trench fill regions 60 to fill the deep trenches, for example, by LPCVD, and then planarized and recessed from the top surface of the pad layer 40 to a second recess depth r2 which is between a top surface of the top semiconductor layer 30 and a bottom surface of the top semiconductor layer 30. The additional conductive trench fill material may be the same as, or different from, the material of the conductive trench fill regions 60. The portion of the additional conductive trench fill material above the pad layer 40 is removed by planarization, which may employ chemical mechanical polishing (CMP), a dry etch, and/or a wet etch. For example, the additional trench fill material may be planarized by chemical mechanical polishing (CMP) employing the pad layer 40 as a stopping layer. The additional conductive trench fill material within the deep trenches is then removed by a second recess etch that recesses top surfaces of the remaining additional conductive trench fill material to a second recess depth r2 below a top surface of the pad layer 40. The second recess depth r2 is located between a top surface of the top semiconductor layer 30 and a bottom surface of the top semiconductor layer 30. The second recess depth r2 is typically about 120 nm, although lesser and greater recess depths are explicitly contemplated herein also.

The remaining portion of the additional conductive trench fill material within the deep trenches is annexed to the conductive trench fill regions 60. Thus, the conductive trench fill regions 60 have substantially horizontal and planar top surfaces located at the second recess depth r2 below the top surface of the pad layer 40. Thus, each of the conductive trench fill regions 60 is electrically connected to a portion of the top semiconductor layer 30.

Figure 6:
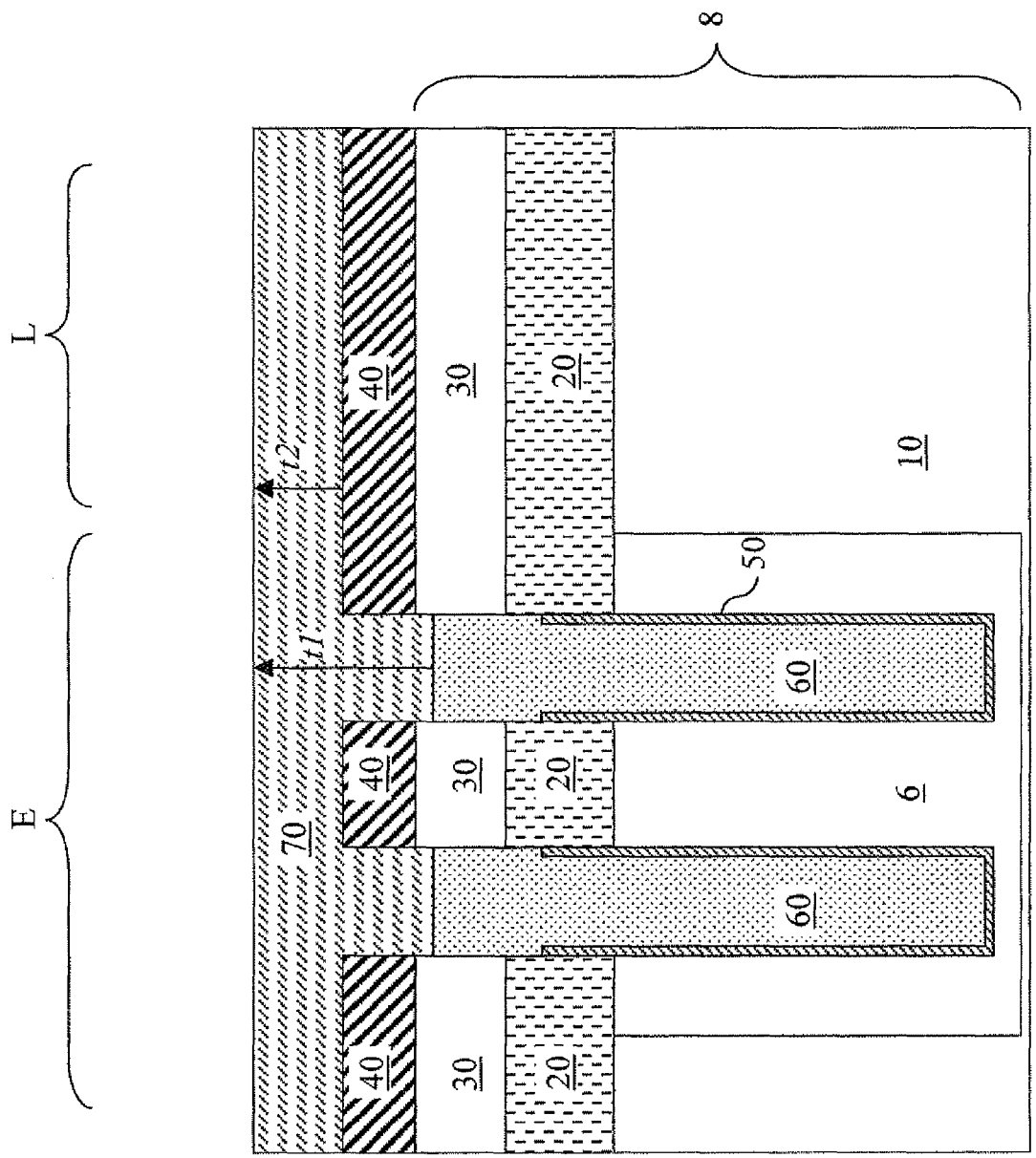

Referring to FIG. 6, a planarizing material layer 70 is formed on the top surfaces of the conductive trench fill regions 60 and the pad layer 40. The planarizing material layer 70 is self-planarizing, i.e., the planarizing material layer 70 generates a substantially flat surface despite underlying topography induced by the recess of the top surfaces of the conductive trench fill regions 60 to the second recess depth r2 from the top surface of the pad layer 40. Thus, a first planarization material layer thickness t1, which is the thickness of the portion of the planarization material layer 70 directly above the conductive trench fill regions 60, is greater than a second planarization material layer thickness t2, which is the thickness of the portion of the planarization material layer 70 above the pad layer 40, by the second recess depth r2. Preferably, the planarization material layer 70 provides a selectivity ratio greater than 1 during a subsequent etch of the pad layer 40 by an anisotropic etch employing the planarization material layer 70 as an etch mask, i.e., the reduction in thickness of the planarization layer 70 is less than the reduction in thickness of the pad layer 40 during the anisotropic etch.

In one embodiment, the planarizing material layer 70 comprises a bottom resist material of a trilayer photoresist system.

Exemplary trilayer photoresist systems are disclosed in U.S. Pat. Nos. 6,242,344 to Koh et al. and 5,030,549 to Hashimoto et al., which are incorporated herein by reference. Specifically, the planarizing material layer 70 might works as an optical dark layer without any photo active component. For the purposes of the present invention, self-planarizing properties and etch selectivity of the bottom resist material to the pad layer 40 are utilized. In the case that the planarization material layer 70 comprises the bottom resist material, the planarization material layer thickness t2 may be from about 50 nm to about 400 nm, and preferably from about 100 nm to about 300 nm, although lesser and greater second planarization material layer thicknesses t2 are explicitly contemplated herein also.

In another embodiment, the planarization material layer 70 comprises a spin-on-glass (SOG). Composition and application methods of the SOG are known in the art. For the purposes of the present invention, self-planarizing properties and etch selectivity of the SOG to the pad layer 40 are utilized. In the case that the second planarization material layer 70 comprises the SOG, the second planarization material layer thickness t2 may be from about 50 nm to about 400 nm, and preferably from about 100 nm to about 200 nm, although lesser and greater second planarization material layer thicknesses t2 are explicitly contemplated herein also.

In yet another embodiment, the planarization material layer 70 comprises a spin-on low dielectric constant (low-k) material. The dielectric constant of the spin-on low-k material is about 3.0 or less, typically less than about 2.8, and more typically less than about 2.5. The spin-on low-k material can be porous or nonporous. Preferably, the spin-on low-k material is non-porous to enhance etch selectivity to the pad layer 40. An example of the spin-on low-k dielectric material is a thermosetting polyarylene ether, which is also commonly referred to as "Silicon Low-K", or "SiLK." The term "polyarylene" is used herein to denote aryl moieties or inertly substituted aryl moieties which are linked together by bonds, fused rings, or inert linking groups such as oxygen, sulfur, sulfone, sulfoxide, carbonyl, etc. In the case that the planarization material layer 70 comprises the SOG, the second planarization material layer thickness t2 may be from about 50 nm to about 600 nm, and preferably from about 150 nm to about 300 nm, although lesser and greater second planarization material layer thicknesses t2 are explicitly contemplated herein also.

Figure 7:
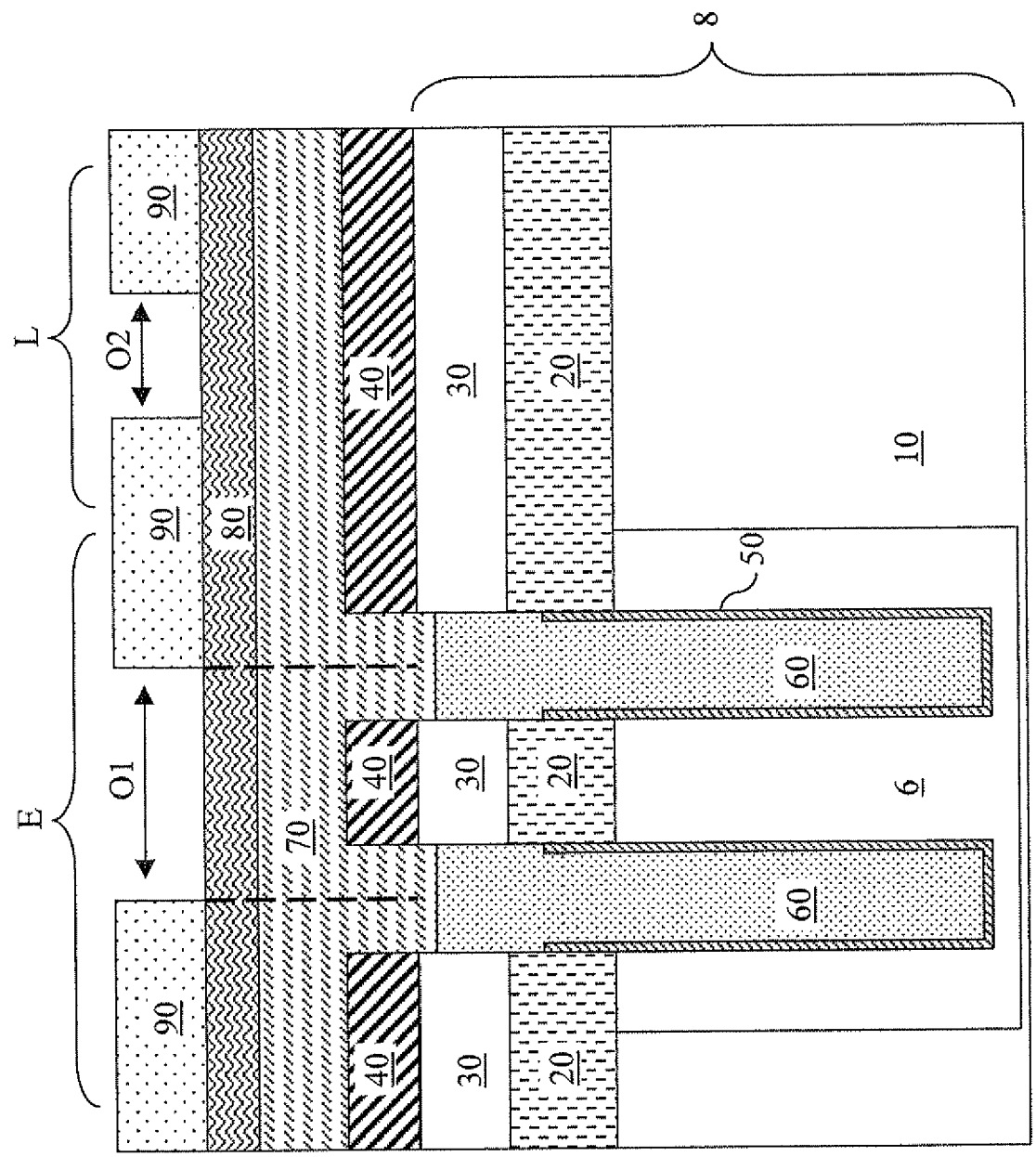

Referring to FIG. 7, a bottom anti-reflective coating (BARC) layer 80 is optionally applied on the planarization material layer 70. The composition of the BARC layer 80 may be the same as an intermediate layer of a trilayer photoresist system known in the art. Alternately, the BARC layer 80 may have the same composition as a BARC material employed in conventional ultraviolet (UV) lithography. The thickness of the BARC layer 80 may be from about 50 nm to about 200 nm, and may be adjusted to optimize lithographic patterning. A second photoresist layer 90 is applied on the top surface of the BARC layer 80. The second photoresist layer 90 may comprise the same material as a top photoresist of a trilayer photoresist system, or may comprise a conventional photoresist employed in ultraviolet (UV) lithography. The thickness of the second photoresist layer 90 may be from about 150 nm to about 600 nm.

A first opening O1 and a second opening O2 are formed in the second photoresist layer 90 by lithographic methods. The first opening O1 is formed in the eDRAM region E directly above a portion of at least one of the deep trenches. Specifically, the first opening O1 is formed straddling the two deep trenches and a portion of the pad layer 40 that laterally abut the two deep trenches. The first opening O1 is formed such that one edge of the first opening O1 directly overlies one of the two conductive trench fill regions 60, and another edge of the first opening O1 directly overlies the other of the two conductive trench fill regions 60. The second opening O2 is formed in the logic region L.

Figure 8:
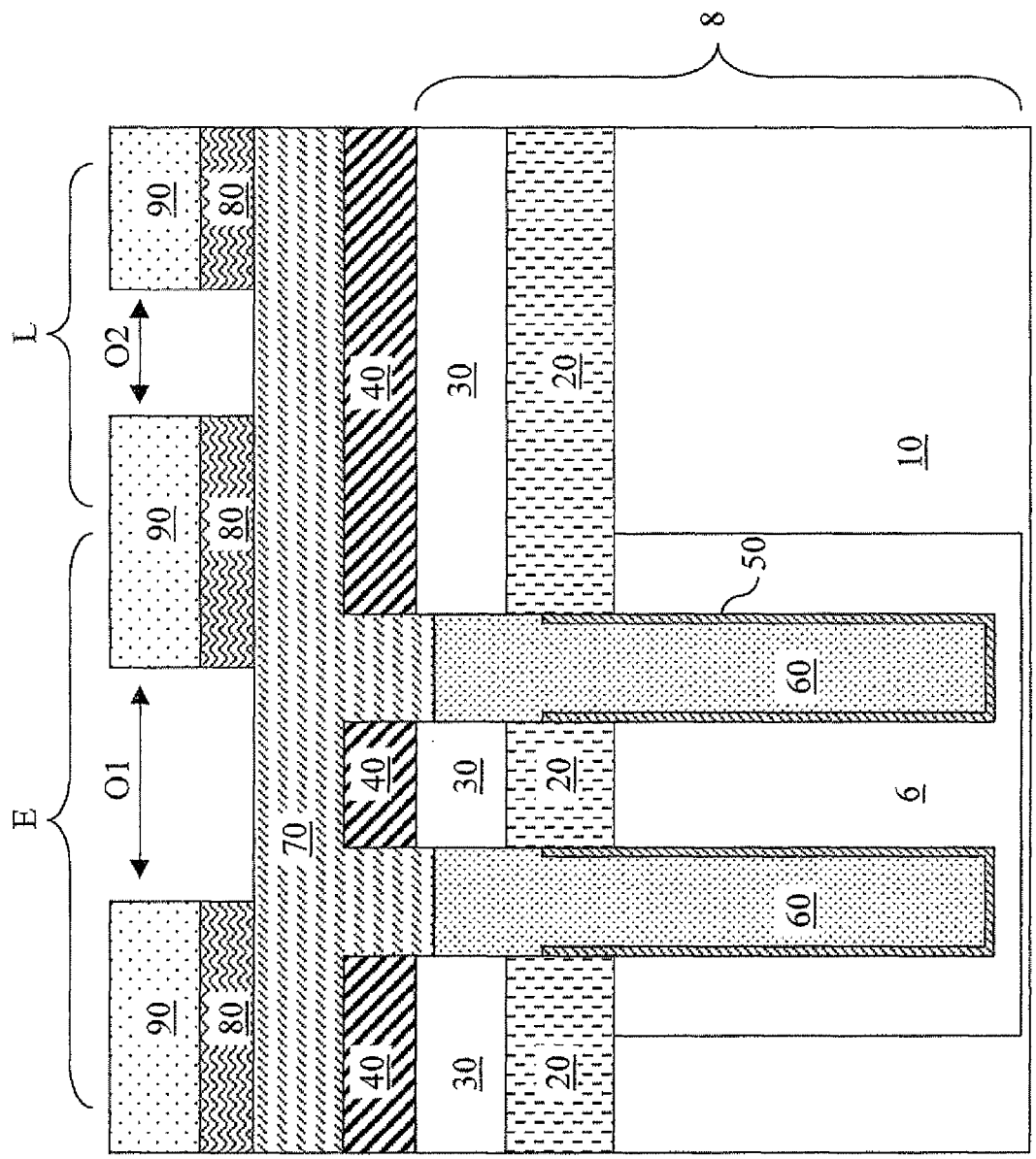

Referring to FIG. 8, the pattern in the second photoresist layer 90 including the first opening O1 and the second opening O2 is transferred into the BARC layer 80, if present, by a first anisotropic etch. Preferably, the first anisotropic etch removes exposed portions of the BARC layer 80 selective to the second photoresist layer 90, i.e., little of the second photoresist layer 90 is removed during the removal of the exposed portions of the BARC layer 80. The first anisotropic etch may, or may not, be selective to the planarization material layer 70. The planarization material layer 70 is exposed underneath the first opening O1 and the second opening O2.

Figure 9:
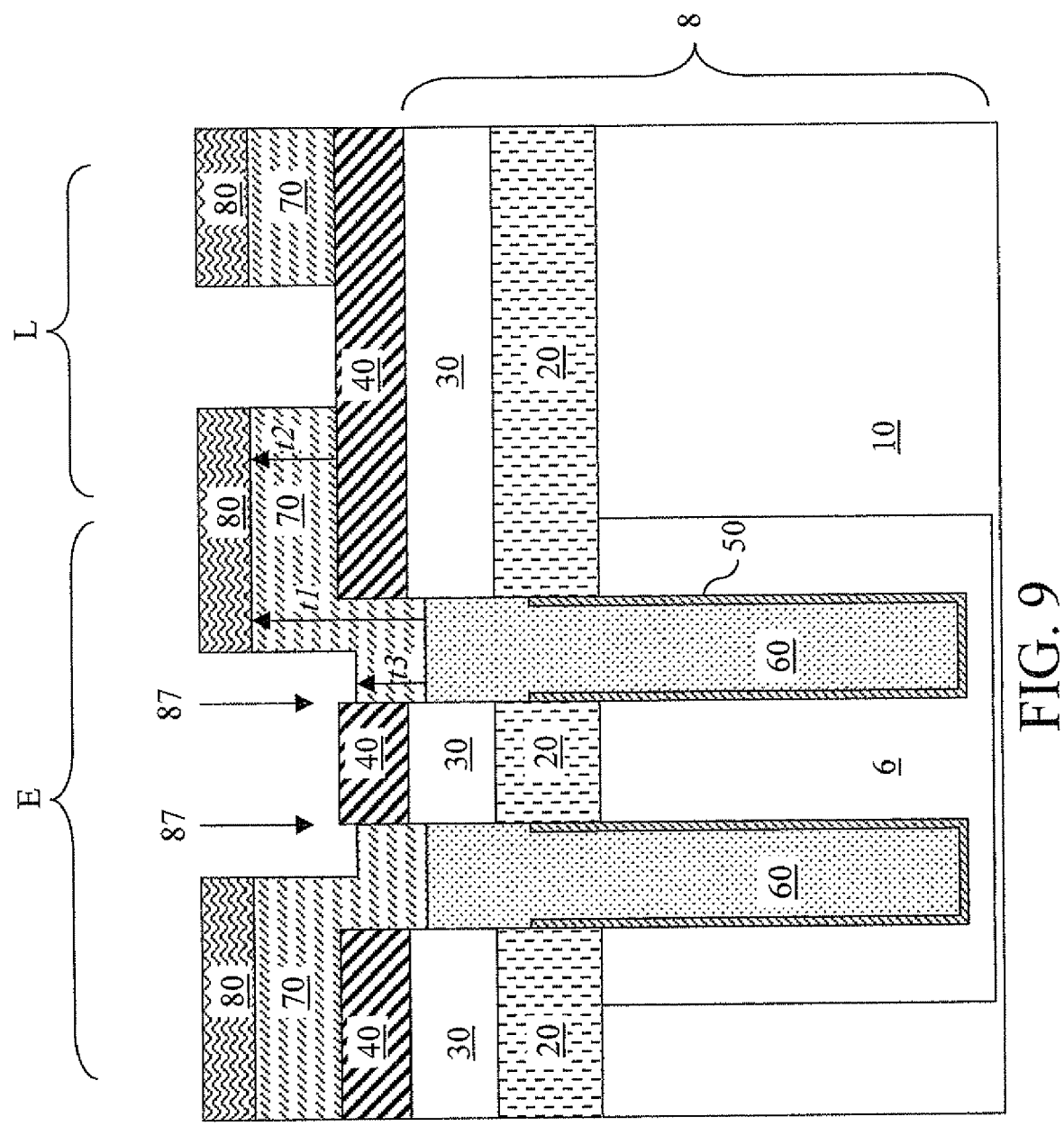

Referring to FIG. 9, a second anisotropic etch is employed to etch exposed portions of the planarization material layer 70. The second photoresist 90 may be consumed partially or completely during the second anisotropic etch. Preferably, the second anisotropic etch may, or may not, be selective to the pad layer 40. Preferably, the exposed portions of the planarization material layer are recessed below the top surface of the pad layer 40. The thickness of the planarization material layer 70 within the exposed portion in the eDRAM region E, which is herein referred to as a third thickness t3, is therefore less than the second recess depth r2 (See FIG. 5).

A pair of vertically coincidental edges 87 of a first stack of a portion of the pad layer 40, a portion of the top semiconductor layer 30, and a portion of the buried insulator layer 20 laterally abuts sidewalls of the two deep trenches. The portion of the pad layer 40 that laterally abuts the two deep trenches is herein referred to as a pad layer portion. The portion of the top semiconductor layer 30 that laterally abuts the two deep trenches is herein referred to as a top semiconductor layer portion. The portion of the buried insulator layer that laterally abuts the deep trenches is herein referred to as a buried insulator layer portion. The pad layer portion laterally abuts the planarization material layer 70. The top semiconductor layer portion laterally abuts the planarization material layer 70 and the two conductive trench fill regions 60. The buried insulator layer portion laterally abuts the two conductive trench fill regions 60 and the node dielectric 50. The pair of vertically coincidental edges 87 of the first stack coincides with sidewalls of the two deep trenches.

Figure 10:
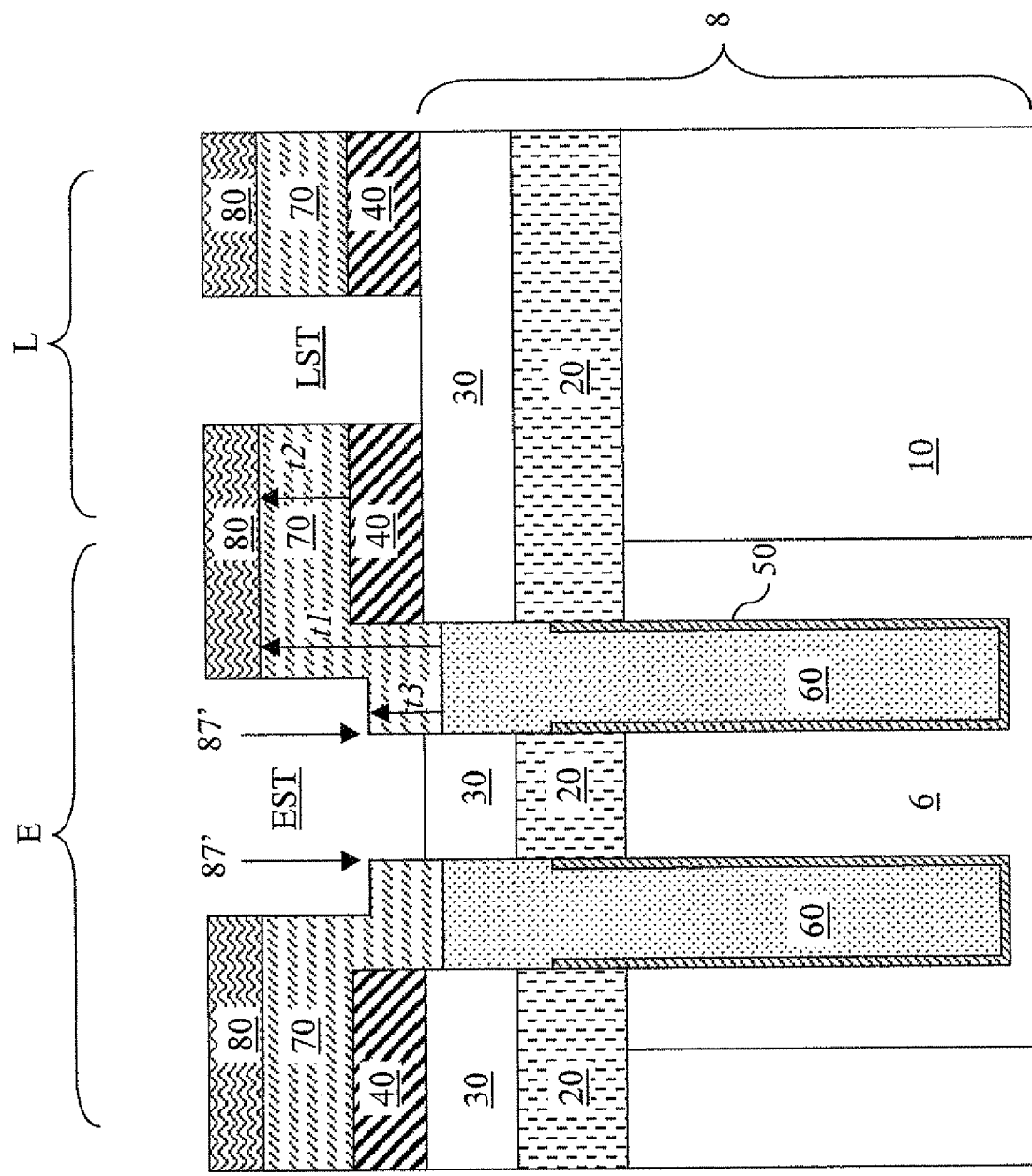

Referring to FIG. 10, a third anisotropic etch is performed to remove exposed portions of the pad layer 40. Preferably, the third anisotropic etch is selective to the BARC layer 80 and the planarization material layer 70. Embodiments are explicitly contemplated herein in which the selectivity of the third anisotropic etch is enhanced by surface treatment of exposed portions of the BARC layer 80 and/or recessed portions of the planarization material layer 70, for example, by ion bombardment, ultraviolet cure, or other densification methods.

After the third anisotropic etch, an eDRAM region shallow trench EST is formed in the eDRAM region E, and a logic region shallow trench LST is formed in the logic region L. A top surface of the top semiconductor layer portion is exposed at the bottom of the eDRAM region shallow trench EST. A top surface of a portion of the top semiconductor layer 30 is exposed at the bottom of the logic region shallow trench LST. After the third anisotropic etch, the planarization material layer 70 has sidewalls that coincide with a pair of vertically coincidental edges 87' of a second stack of the top semiconductor layer portion and the buried insulator layer portion. The pair of vertically coincidental edges 87' of the second stack coincides with sidewalls of the two deep trenches.

Figure 11:
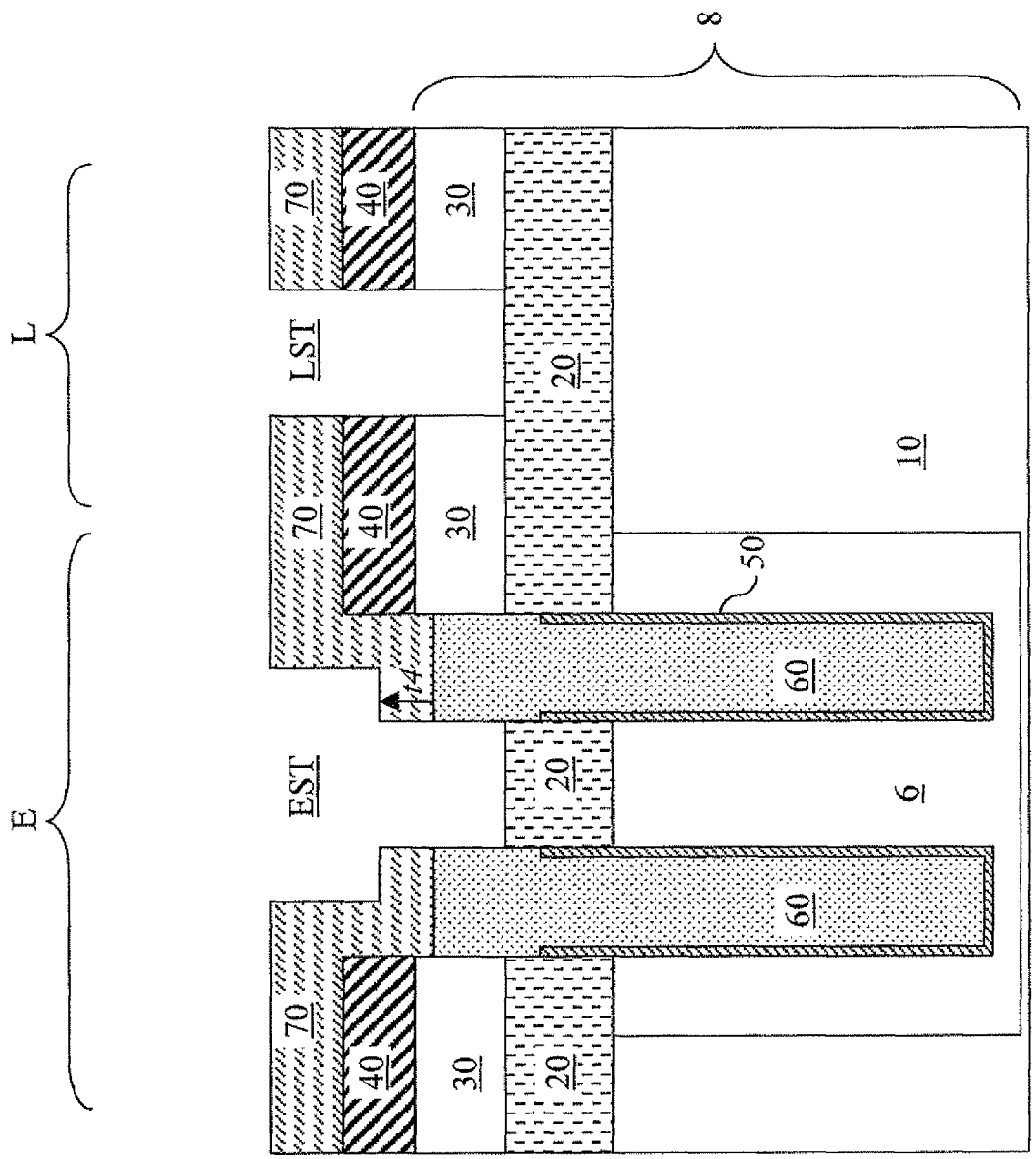

Referring to FIG. 11, a fourth anisotropic etch is performed to remove exposed portions of the top semiconductor layer 30. The fourth anisotropic etch has enough selectivity to the planarization material layer 70 during the removal of the exposed portions of the top semiconductor layer 30. Thus, a portion of the planarization material layer 70 remains above the entirety of the two conductive trench fill regions 60 after the fourth anisotropic etch. In other words, the thickness of the recessed portions of the planarization material layer 70 in the eDRAM region E, which is herein referred to as a fourth thickness t4, is positive. The BARC layer 80 may be completely or partially removed during the fourth anisotropic etch. Embodiments are explicitly contemplated in which the selectivity of the fourth anisotropic etch is enhanced by surface treatment of exposed portions of the BARC layer 80 and/or the recessed portion of the planarization material layer 70, for example, by ion bombardment, ultraviolet cure, or other densification methods. After the fourth anisotropic etch, the planarization material layer 70 has sidewalls that coincide with sidewalls of the buried insulator layer portion, i.e., the portion of the buried insulator layer 20 that laterally abut the sidewalls of the two deep trenches.

In some embodiments, the fourth anisotropic etch is selective to the buried insulator layer 20. In the case that the fourth anisotropic etch is selective to the buried insulator layer 20, the forth anisotropic etch extends the eDRAM region shallow trench EST and the logic region shallow trench LST downward by the thickness of the top semiconductor layer 30. A top surface of the buried insulator layer portion is exposed at the bottom of the eDRAM region shallow trench EST. A top surface of a portion of the buried insulator layer 20 is exposed at the bottom of the logic region shallow trench LST. The top surface of the buried insulator layer 20 is located at the same depth throughout the SOI substrate 8.

In the case that the fourth anisotropic etch is not selective to the buried insulator layer 20, the fourth anisotropic etch extends the eDRAM region shallow trench EST and the logic region shallow trench LST downward by more than the thickness of the top semiconductor layer 30. The exposed portions of the top surface of the buried insulator layer 20 are located at a depth greater than the depth of unexposed portions of the buried insulator layer 20.

After the fourth anisotropic etch, the planarization material layer 70 has sidewalls that vertically coincide with sidewalls of the two deep trenches. Sidewalls of the two conductive trench fill regions 60 are exposed after the fourth anisotropic etch.

The first, second, third, and fourth anisotropic etch steps described above may be performed in an integrated mode, a de-integrated mode, or a mix of integrated mode and de-integrated mode. In an integrated mode, all those four anisotropic etch steps are performed sequentially on the same etch platform, and preferably same etch chamber. The SOI substrate 8' remains in the chamber until all those etch steps are completed. In a de-integrated mode, the SOI substrate 8' is taken out of the chamber after each etch step and transferred to another chamber for next etch step. In the mix of integrated mode and de-integrated mode, some but not all of those etch steps are performed in the same chamber without taking out the SOI substrate 8'.

Figure 12:
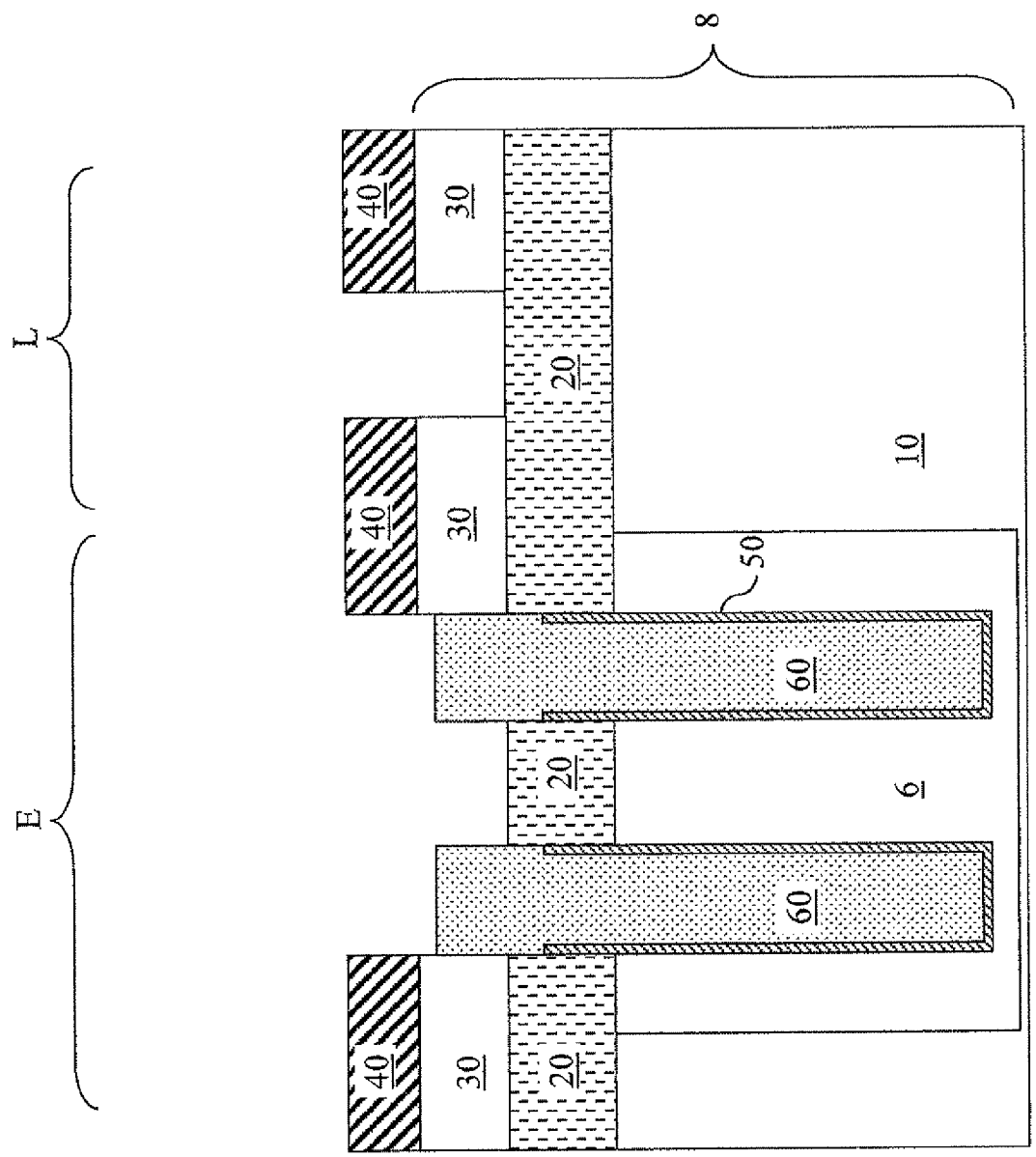

Referring to FIG. 12, the planarization material layer 70 is removed by an etch. In some instances, the etch is selective to the buried insulator layer 20, the two conductive trench fill regions 60, the top semiconductor layer 30, and the pad layer 40. The etch may be a wet etch or a dry etch. For example, in the case that the planarization material layer 70 comprises a bottom resist material of a trilayer photoresist system, the etch may be an ashing process or wet process in sulfuric acid containing solution or both ashing and wet process. In another example, the planarization material layer 70 comprises an SOG and the etch may be an anisotropic reactive ion etch and/or a wet etch. In yet another example, the planarization material layer 70 comprises SiLK™ and the etch may be a wet etch having selectivity to semiconductor materials of the two conductive trench fill regions 60 and the top semiconductor layer 30. Alternative etch processes may also be employed.

Figure 13:
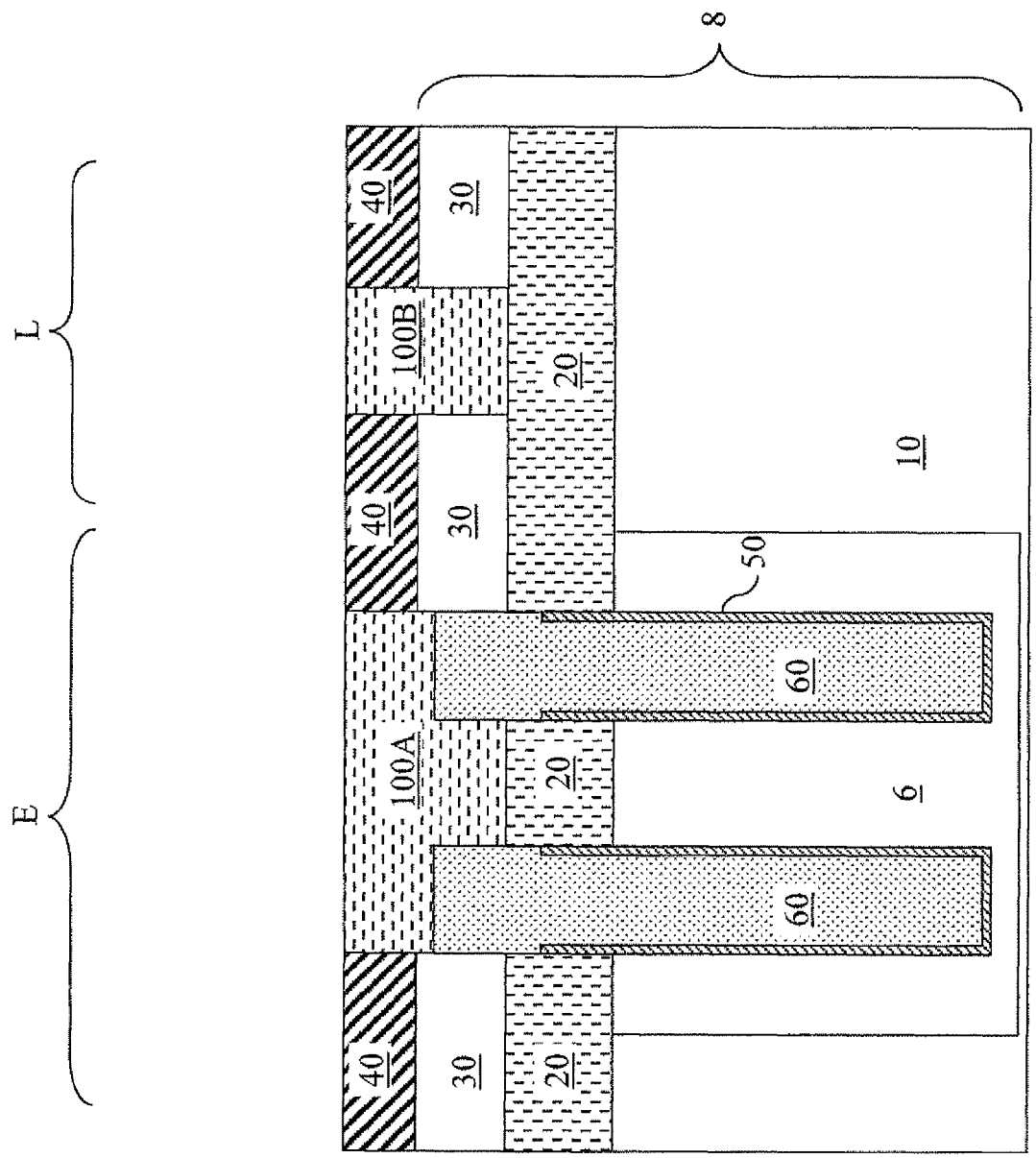

Referring to FIG. 13, a first shallow trench isolation portion 100A is formed in the eDRAM region E, and a second shallow trench isolation portion 100B is formed in the logic region L by deposition of a dielectric material, followed by planarization of the deposited dielectric material above the pad layer 40. The dielectric material comprises a dielectric oxide, a dielectric nitride, or both. For example, the second shallow trench isolation portion 100B and the first shallow trench isolation structure 100A may comprise a silicon oxide such as tetra-ethyl-ortho-silicate (TEOS) oxide, undoped silicate glass (USG), and/or other silicon oxide formed by chemical vapor deposition (CVD), or by high density plasma (HDP) CVD. The planarization of the deposited dielectric material may be effected by chemical mechanical polishing (CMP) and/or a recess etch. Optionally, the pad layer 40 may be employed as a stopping layer for the CMP and/or an etch-stop layer for the recess etch.

Figure 14:
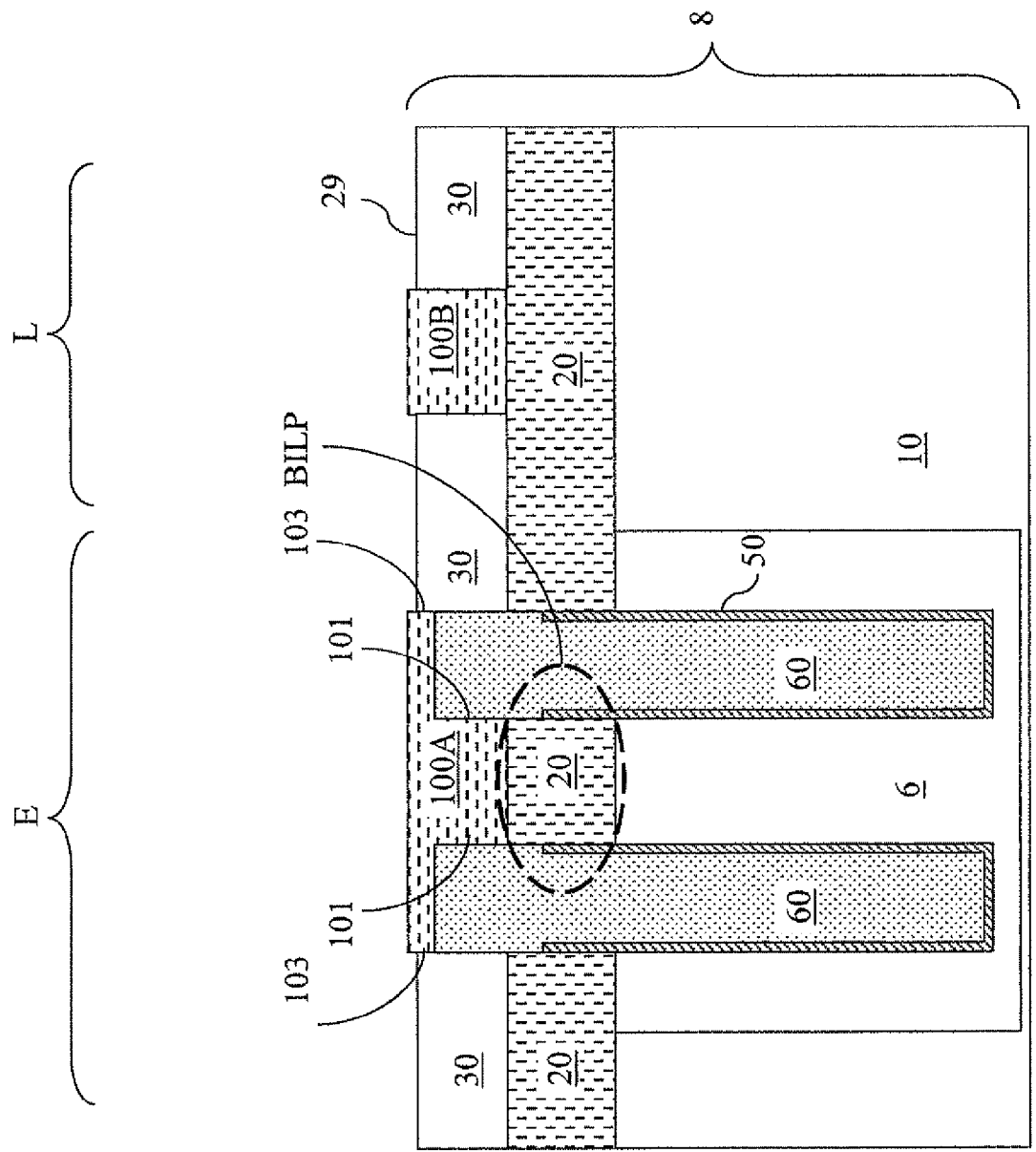

Referring to FIG. 14, the pad layer 40 is removed, for example, by a wet etch. In the case that the pad layer 40 comprises silicon nitride, the wet etch may employ hot phosphoric acid. The first shallow trench isolation portion 100A and the second shallow trench isolation portion 100B are recessed by an etch to a level close to a top semiconductor layer top surface 29, which is a top surface of the top semiconductor layer 30. The recess of the shallow trench isolation portion 100A and 100B can be performed before or after the pad layer 40 is removed. The etch may be a dry etch or a wet etch. The top surfaces of the first shallow trench isolation portion 100A and the second shallow trench isolation portion 100B may be substantially coplanar with, located above, or located below the top semiconductor layer top surface 29. Typically, any difference in height between the top semiconductor layer top surface 29 and the top surfaces of the first shallow trench isolation portion 100A and the second shallow trench isolation portion 100B is less than 50 nm, and more typically less than 25 nm.

The first exemplary semiconductor structure comprises:

a deep trench, which is one of the two deep trenches, located in a semiconductor-on-insulator (SOI) substrate 8;

a conductive trench fill region 60, which is one of the two conductive fill regions 60, located in the deep trench and laterally abutting a portion of a top semiconductor layer 30;

a first shallow trench isolation structure 100A having a lower sidewall 101 that is self-aligned to and adjoined to a sidewall of a portion of a buried insulator layer 20, which is the buried insulator layer portion located in an oval labeled "BILP," wherein the portion laterally abuts the conductive trench fill region 60; and a second shallow trench isolation structure 100B disjoined from the deep trench and vertically abutting the buried insulator layer 20.

Each of the lower sidewalls 101 of the first shallow trench isolation structure 100A laterally abuts, and is self-aligned to, a sidewall of the deep trench. The sidewall of each of the deep trench extends from a bottommost surface of the deep trench to a topmost surface of the conductive trench fill region 60 within the deep trench without a step or a kink. Each of the lower sidewall 101 is substantially vertically coincident with, and is self-aligned to an outer edge of a node dielectric 50 in one of the deep trenches. Each of the lower sidewalls 101 laterally abuts, and is self-aligned to, an outer edge of one of the two conductive trench fill regions 60. Each of the conductive trench fill regions 60 has a substantially constant horizontal cross-sectional area between a topmost surface of the conductive trench fill region 60 and a top surface of a node dielectric 50. The top surface of the node dielectric 50 is located between a top surface of the buried insulator layer 20 and a bottom surface of the buried insulator layer 20. Each of the conductive trench fill regions 60 is free of a step between a planar topmost surface of the conductive trench fill region 60 and a top surface of the buried insulator layer 20.

The first shallow trench isolation structure 100A further comprises upper sidewalls 103 that laterally abut the top semiconductor layer 30.

Figure 15:
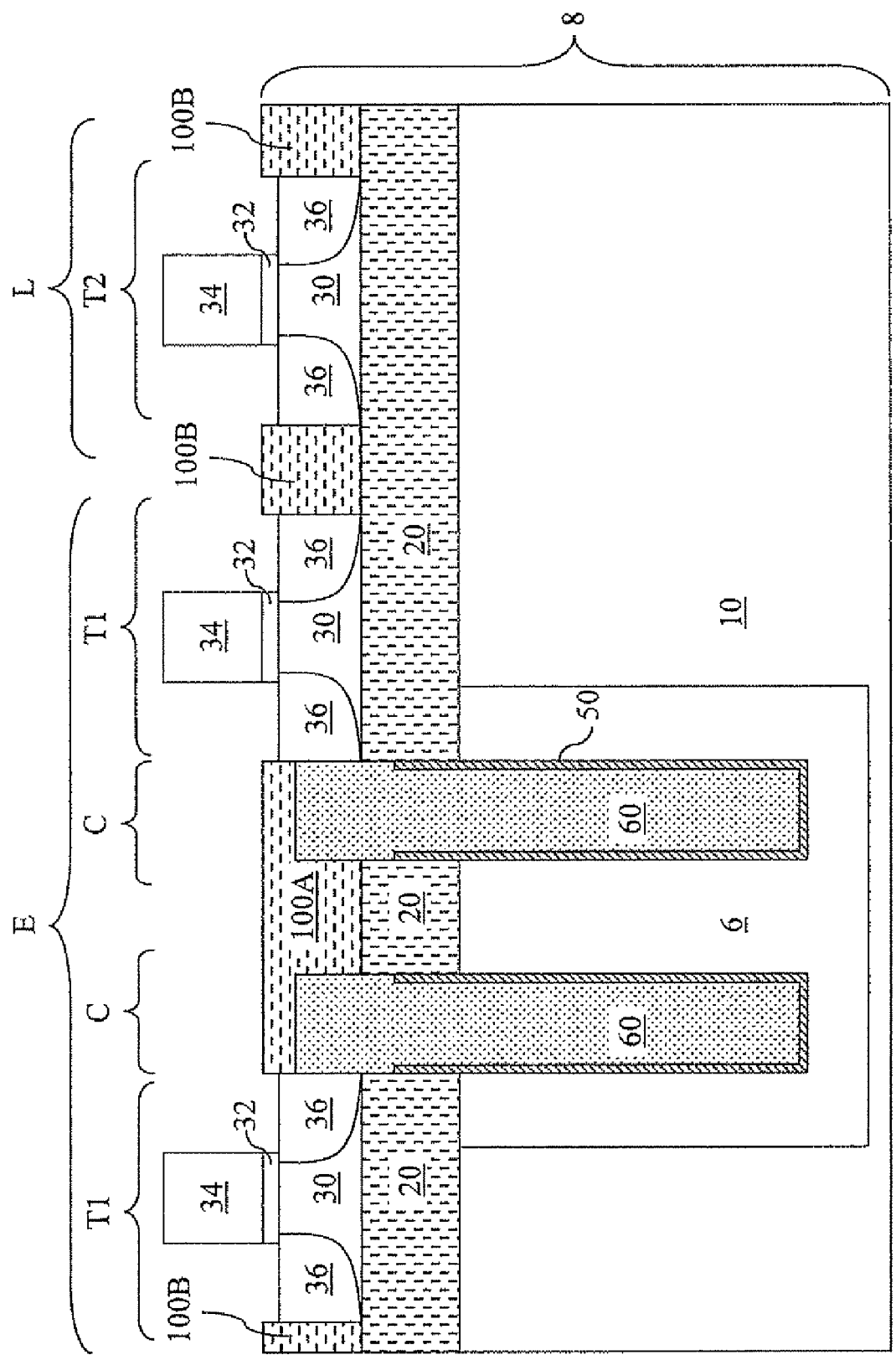
FIG. 15 is a vertical cross-sectional view of a second exemplary structure according to the present invention.

Referring to FIG. 15, a second exemplary semiconductor structure according to the present invention comprises two first transistors T1 formed in the eDRAM region E and a second transistor T2 formed in the logic region. Each of the two first transistors T1 and the second transistor T2 comprises a gate dielectric 32, a gate conductor 34, and source and drain regions 36 formed in the top semiconductor layer 30. The eDRAM region further comprises two capacitors C, each of which laterally abuts, and is electrically connected to, one of the two first transistors T1. A pair of a first transistor T1 and a pair of capacitors C constitutes a pair of eDRAM cells. Each cell is mirrored together in the second exemplary semiconductor structure, which shows in particular, a first shallow trench isolation structure 100A between the two capacitors C. The second transistor T2 in the logic region L is not directly connected to a capacitor. The second transistor T2 is employed in a logic circuit, which may utilize the eDRAM cells in the eDRAM region E during operation. The geometric features of the first shallow trench isolation structure 100A relative to the conductive trench fill regions 60, the portion of the buried insulator layer 20, and the node dielectric 50 are the same as in the first exemplary semiconductor structure.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of fabricating a semiconductor structure comprising:

forming a pad layer on a semiconductor-on-insulator (SOI) substrate;

forming at least two deep trenches in said pad layer and said SOI substrate;

forming a conductive trench fill region in each of said at least two deep trenches, wherein said conductive trench fill region has an upper conductive surface that is recessed below a top surface of said SOI substrate and said forming said conductive trench fill region includes filling said at least two deep trenches with a conductive trench fill material; planarizing and recessing said conductive trench fill material to a first recess depth below a top surface of a buried insulator layer within said deep trench; filling said deep trench with another conductive trench fill material; and planarizing and recessing said another conductive trench fill material to a second recess depth below a top surface of said pad layer within said deep trench, wherein said second recess depth is less than said first recess depth;

applying a planarization material layer on the upper conductive surface of said conductive trench fill region and said pad layer;

applying a bottom anti-reflective coating (BARC) layer on said planarization material layer;

applying a photoresist layer on said BARC layer;

patterning and etching the photoresist layer, the BARC layer, and the planarization material layer to expose a portion of the pad layer between the at least two deep trenches, wherein a portion of at least the planarization material layer is present atop the upper conductive surface;

removing the portion of said pad layer between the at least two deep trenches, wherein a top semiconductor portion between the at least two deep trenches of said SOI substrate is exposed, and a remaining portion of said pad layer includes a sidewall that is vertically coincident with, and is directly adjoined to, a sidewall of said deep trench, and wherein said top semiconductor portion laterally contacts another sidewall of said deep trench;

removing said top semiconductor portion between the at least two deep trenches and exposing a top surface of a buried insulator layer of said SOI substrate;

removing remaining portions of the photoresist layer, the BARC layer, and the planarization material layer; and forming a shallow isolation trench structure having a first portion directly on said top surface of said buried insulator layer and a second portion directly on the upper conductive surface of said conductive trench fill region, wherein said first portion and second portion of the shallow trench isolation structure are simultaneously formed.

2. The method of claim 1, wherein said shallow trench isolation structure comprises a lower sidewall which laterally contacts, and is self-aligned to, said sidewall of said deep trench, wherein said sidewall of said at least two deep trenches extends from a bottom most surface of said at least two deep trenches to a topmost surface of said conductive trench fill region without a step or a kink.

3. The method of claim 1, further comprising forming a node dielectric on sidewalls of said deep trench prior to said forming of said conductive trench fill region.

4. A method of fabricating a semiconductor structure comprising:

forming a pad layer on an upper surface of a semiconductor-on-insulator (SOI) substrate;

forming a deep trench in said pad layer and said SOI substrate;

forming a node dielectric on sidewalls of said deep trench;

forming a conductive trench fill region in said deep trench, wherein a topmost surface of said conductive trench fill region is recessed below a top surface of said SOI substrate and wherein said forming the conductive trench fill region includes filling said deep trench with a conductive trench fill material, planarizing and recessing said conductive trench fill material to a first recess depth below a top surface of a buried insulator layer within said deep trench, removing exposed portions of said node dielectric, filling said deep trench with another conductive trench fill material, and planarizing and recessing said another conductive trench fill material to a second recess depth below a top surface of said pad layer within said deep trench, wherein said second recess depth is less than said first recess depth, and wherein said conductive trench fill material and said another conductive trench fill material within said deep trench collectively constitute said conductive trench fill region;

removing a portion of said pad layer after said forming of said conductive trench fill region, wherein a top semiconductor portion of said SOI substrate is exposed by said removing of said portion of said pad layer, and a remaining portion of said pad layer includes a sidewall that is vertically coincident with, and is directly adjoined to, a sidewall of said deep trench, and wherein said top semiconductor portion laterally contacts another sidewall of said deep trench;

removing said top semiconductor portion and exposing a top surface of a buried insulator layer of said SOI substrate; and forming a shallow isolation trench structure directly on said top surface of said buried insulator layer and said conductive trench fill, wherein an upper surface of the shallow trench structure is vertically offset and above an upper surface of the semiconductor-on-insulator (SOI) substrate.

* * * * *